United States Patent [19]

Thomas et al.

[11] 4,416,054

[45] Nov. 22, 1983

[54] METHOD OF BATCH-FABRICATING FLIP-CHIP BONDED DUAL INTEGRATED CIRCUIT ARRAYS

[75] Inventors: Richard N. Thomas, Franklin Borough; Michael M. Sopira, Pittsburgh, both of Pa.

[73] Assignee: Westinghouse Electric Corp., Pittsburgh, Pa.

[21] Appl. No.: 427,333

[22] Filed: Sep. 29, 1982

Related U.S. Application Data

[62] Division of Ser. No. 165,158, Jul. 1, 1980, Pat. No. 4,369,458.

[51] Int. Cl.³ ............................................. H01L 21/28
[52] U.S. Cl. ...................................... 29/572; 29/576 J; 29/577 R; 29/583; 29/589
[58] Field of Search .................. 29/572, 576 J, 577 C, 29/577 R, 583, 589

[56] References Cited

U.S. PATENT DOCUMENTS

| | | | |
|---|---|---|---|
| 3,811,186 | 5/1974 | Larnerd et al. | 29/577 R X |
| 3,871,015 | 3/1975 | Lin et al. | 357/65 X |
| 3,913,216 | 10/1975 | Ballonoff | 29/589 X |
| 4,067,104 | 1/1978 | Tracy | 29/578 X |
| 4,100,672 | 7/1978 | King et al. | 29/577 C X |
| 4,127,863 | 11/1978 | Kurata | 357/65 X |
| 4,142,925 | 3/1979 | King et al. | 29/572 X |
| 4,190,851 | 2/1980 | Finnila et al. | 357/30 |
| 4,197,633 | 4/1980 | Lorenze et al. | 29/577 R |
| 4,206,470 | 6/1980 | White | 357/30 |
| 4,369,458 | 1/1983 | Thomas et al. | 357/30 |

*Primary Examiner*—G. Ozaki
*Attorney, Agent, or Firm*—W. E. Zitelli

[57] ABSTRACT

A focal plane array including a first integrated circuit for infrared radiation (IR) detection and a second integrated circuit for signal processing is assembled in a flip-chip structural configuration. Each integrated circuit includes an array of metallic contacts on a surface thereof for interconnection in the flip-chip arrangement. The contact array of the IR detector includes a substantially greater number of contacts than the contact array of the signal processor. Consequently, it is not a prerequisite to precisely align the two integrated circuits in a one-to-one contact relationship for the flip-chip bonding operation therebetween. Thus, each metallic contact of the signal processor may be roughly aligned and bonded to a corresponding group of metallic contacts of the IR detector array without altering significantly the operation of the overall focal plane array as long as at least one metallic contact of the IR detector array is included in each corresponding contact group. As a result of this structural improvement, a method of batch-fabricating a plurality of high-density focal plane arrays may be accomplished quite expeditiously.

8 Claims, 11 Drawing Figures

METHOD OF BATCH-FABRICATING FLIP-CHIP BONDED DUAL INTEGRATED CIRCUIT ARRAYS

This is a division of application Ser. No. 165,158, filed July 1, 1980 now U.S. Pat. No. 4,369,458.

BACKGROUND OF THE INVENTION

The present invention relates to focal plane array configurations in general, and more particularly, to a flip-chip focal plane array structure and method of batch-fabricating a plurality of the same in which precision alignment of the interconnection contacts between an infrared radiation detector integrated circuit and a signal processor integrated circuit of the focal plane array is avoided.

Generally, it is desired to fabricate the infrared radiation detector integrated circuit and the signal processor integrated circuit of a focal plane array configuration separately. The infrared radiation detector integrated circuit of the focal plane array generally comprises a substrate wafer of a material composition which provides the properties of being sensitive to a predetermined wavelength window of infrared radiation. One side of the substrate may be doped appropriately for infrared radiation impingement thereon, the doped surface region generally being anti-reflective to the infrared radiation. The other side of the infrared radiation detector wafer usually has an array of regions doped with impurities, each being covered with a metallic contact. Each contact of the infrared detector array may provide an electrical signal representative of a picture element or pixel of the IR image which impinges the surface area of the one side thereof. Presently, infrared detectors of this type have arrays on the order of 16×32 or 32×32 pixels, but much larger arrays are being proposed.

The other integrated circuit of the focal plane array configuration is generally a signal processing microelectronic circuit, like a charge coupled device (CCD), for example. Each cell of the array of the charge coupled device is geometrically aligned to be in a 1 to 1 dimensional correspondence with each picture element contact of the infrared detector integrated circuit array and metallic contacts are formed at injection input points of each of the charge coupled device cells.

In connecting the two integrated circuits together to form the focal plane array configuration, each pixel contact of the infrared detector is coupled correspondingly to each cell of the signal processor chip. Accordingly, the two integrated circuits are connected together on an element-to-element basis with well-known metal bonding techniques, the operation being commonly referred to as a flip-chip fabrication method. For an example of such a flip-chip configuration, reference is herein made to the U.S. issued U.S. Pat. No. 4,067,104, issued to John M. Tracey on Jan. 10, 1978 and entitled, "Method of Fabricating an Array of Flexible Metallic Interconnects for Coupling Microelectronics Components".

It is clearly evident that prior to these 1 to 1 metal bonding operations of the flip-chip focal plane arrays, some precision registration step must be implemented. In some cases, "see through" (infrared or X-ray) or front-to-back surface reflection alignment techniques are relied upon to achieve the precise registry required between the large number of array contacts of the detector and signal processor on a 1 to 1 basis. At the very high detector array densities and fine geometries being proposed for utilization in focal plane array technology, it is understood that the precision alignment step is likely to become a difficult and time-consuming task which appears incompatible with the high volume and low cost benefits of modern semiconductor fabrication technology.

Consequently, it appears that a process-compatible interconnect bonding technology should be adopted for achieving parallel interconnection of many thousands of electrical connections simultaneously in one operation in connection with bonding the arrays of the microelectronic infrared detector and signal processing chips of an infrared focal plane array configuration. The technology should, of course, avoid the need for high precision alignment of the infrared detector and signal processing arrays.

SUMMARY OF THE INVENTION

In accordance with the broad principles of the present invention, a flip-chip interconnected focal plane array circuit configuration includes a first integrated circuit for signal processing having a first array of electrical signal storage cells each having an injection site and a metallic cell contact disposed at the site to provide electrical connection thereto; and a second integrated circuit for radiation detection, preferably that in the infrared spectrum region, having a substrate with a first side conditioned for accepting a radiation image thereon, and a second side, opposite the first side, including an array of metallic detector contacts disposed on the surface thereof. In the configuration, the second array has a greater density of contacts than the first array for substantially equal surface areas and the metallic detector contacts are smaller in physical size than the metallic cell contacts. Accordingly, the first and second circuits are interconnected in a flip-chip configuration with each metallic cell contact of the first circuit being bonded physically to a corresponding group of metallic detector contacts of said second circuit. Each corresponding bonded group of metallic detector contacts defines a corresponding volume in the substrate of the second integrated circuit and an associated surface area on the first side thereof.

In operation, the radiation image accepted by the first side of the second integrated circuit is divided into picture elements in accordance with the defined associated surface areas. Electrical signals representative of the radiation image elements are photogenerated in the corresponding volumes of the second circuit and then conducted to the correspondingly associated cells of the first circuit, through their metallic cell and detector contact bondings, to form compositely in the storage cell array thereof an electrical representation of the radiation image accepted by the second circuit.

More specifically, in one embodiment of the flip-chip circuit configuration, the substrate of the second integrated circuit comprises an extrinsically doped semiconductor material having the properties of detecting infrared radiation in a predetermined window and of converting the detected infrared radiation to an electrical signal elementally by photoconductive techniques. The photoconductive radiation detector elements are defined by the cellular bonded groups of metallic detector contacts. The metallic cell and detector contacts for this embodiment are primarily gold.

In a second embodiment of the flip-chip circuit configuration, the substrate of the second integrated circuit comprises an intrinsic material having the properties of detecting infrared radiation in a predetermined wavelength window and of converting the detected radiation to an electrical signal elementally by photovoltaic techniques. The photovoltaic radiation detector elements are defined by the cellular bonded groups of metallic detector contacts. In this second embodiment, the metallic cell and detector contacts are primarily indium.

In either embodiment, the first integrated circuit preferably comprises a charge-coupled device having a first parallel input cell array and accompanying cell injection metallic contacts. In addition, the first array of metallic cell contacts may be configured on a surface of the first integrated circuit as a two-dimensional array of rows and columns having center-to-center spacings of a first predetermined distance and similarly, the second array of metallic detector contacts may be configured on the surface of the second side of the second integrated circuit as a two-dimensional array of rows and columns having center-to-center spacings of a second predetermined distance which is substantially less than the first predetermined distance. Still further, the metallic detector contacts may be considered as metal pads of a first type and first maximum cross-sectional area and the metallic cell contacts may be considered as metal bumps of a second height and second maximum cross-sectional area wherein the second height is substantially greater than the first height and the second maximum area is substantially greater than the first maximum area. Furthermore, preferably the physical bonding connection between the metallic cell and detector contacts may be one of a thermal compression bond.

Another aspect of the present invention includes a method of fabricating a plurality of high-density flip-chip bonded dual integrated circuit arrays. Broadly then, the steps include fabricating a first integrated circuit for signal processing having a first array of electrical signal storage cells with an injection region and a metallic cell contact disposed at each cell; fabricating a second integrated circuit for radiation detection having a substrate with a first side conditioned for accepting a radiation image thereon and a second side, opposite the first side, including a second array of metallic detector contacts disposed on the surface thereof, the second array being fabricated with a greater density of contacts than the first array for substantially equal surface areas, each metallic detector contact being fabricated of a physical size which is smaller than said metallic cell contacts; bonding each metallic cell contact of the first integrated circuit to a corresponding group of metallic detector contacts of the second integrated circuit to render a dual integrated circuit flip-chip configuration; and dividing the bonded dual integrated circuit flip-chip configuration into a predetermined plurality of high-density dual integrated circuit flip-chip bonded arrays.

More specifically, the first integrated circuit may include the step of electroplating at least one metallic material on the surface of the first integrated circuit at each cell injection region to provide the first array of metallic cell contacts. Further, the fabrication of the second integrated circuit may include electroplating at least one metallic material at each of the second array geometric positions on the surface of the second side of the second integrated circuit to provide the second array of metallic detector contacts. Moreover, the bonding step may include thermal compression bonding of each metallic cell contact of the first integrated circuit with its corresponding group of metallic detector contacts of the second integrated circuit, concurrently, to render the dual integrated circuit flip-chip configuration.

In greater detail, then, the step of dividing may include the steps of providing a mechanical support for the bonded dual integrated circuit flip-chip configuration, predefining each of the plurality of dual integrated circuit arrays; physically sectioning the predefined circuit arrays from each other; and removing the section plurality of circuit arrays from their mechanical support. More particularly, the dividing step may further include the steps of disposing the bonded dual integrated circuit flip-chip configuration on the surface of a flat support member; flowing a material, which is liquid at temperatures above a first temperature, preferably room temperature, between the dual integrated circuits of the flip-chip configuration and between the configuration and said flat support member at temperatures above said first temperature; allowing the material to cool below the first temperature and become solid to provide a mechanical support for the bonded dual integrated circuit configuration; defining each of the plurality of dual integrated circuit arrays in accordance with predetermined physical dimensions thereof; cutting the predefined circuit arrays away from each other, preferably by sawing, along the predetermined physical dimensions; and removing the material from the cut-away circuit arrays, preferably by cleaning the material from the surfaces, to release them from their mechanical support.

DESCRIPTION OF THE PREFERRED EMBODIMENT

Figure 1B:
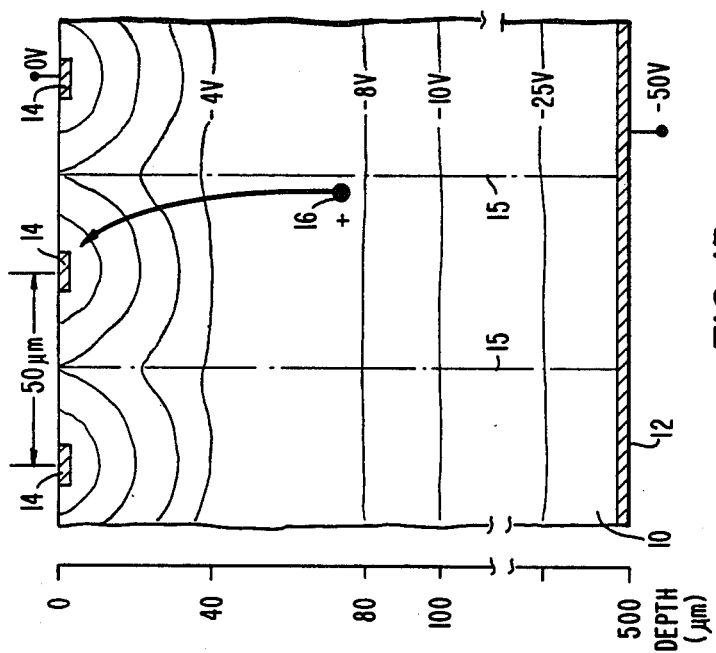
FIGS. 1A and 1B depict schematically a cross-sectional portion of an extrinsically doped silicon radiation detector array to illustrate how the shape of the equipotentials formed within the substrate change with respect to the surface area of the array detector contacts.
Figure 1A:
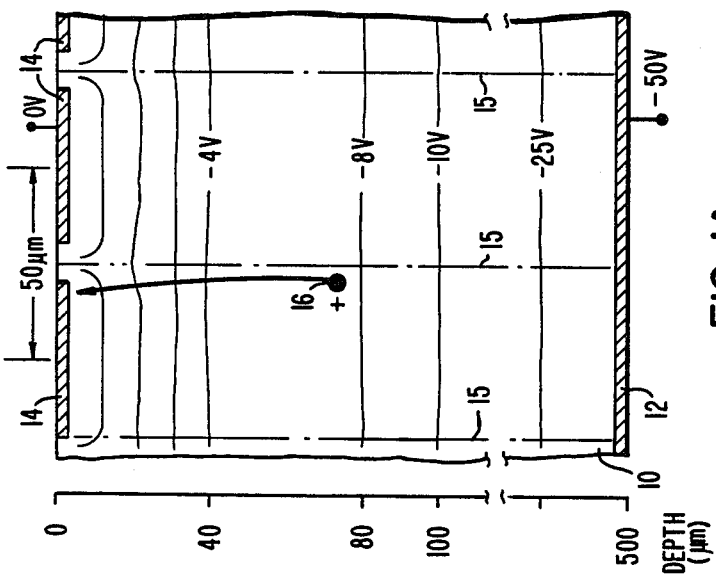

FIGS. 1A and 1B depict schematically a cross-section of a portion of an extrinsically doped silicon radiation detector array. In each FIGS. 1A and 1B, the substrate 10 may be comprised of an indium doped silicon material. In each case, a contiguous photoconductive array may be formed by providing a continuous transparent infrared ohmic contact 12 to a first side of the substrate wafer 10 and a two-dimensional array of ohmic contacts 14 to the opposite or second side. As is well known in the pertinent art, these ohmic contacts 14 may be formed by diffusing impurities at predefined areas on a substrate surface or, on the other hand, by ion implanting impurities to these same predefined areas and annealing such implantations at low temperatures.

Typically, the substrate wafer thickness, which may be on the order of 0.02 inches (500 micrometers), is utilized to achieve quantum efficiencies approaching approximately 50%. Normally, an elemental radiation detector zone of a contiguous radiation detector array, partitioned by the dashed lines 15, is defined by the center-to-center separation of the two-dimensional detector contacts 14 which may be typically 40 micrometers on a side and be spaced on 50 micrometer centers. In these conventional arrays, electrical cross talk between the elemental detector zones, which may have a volumetric semiconductor wafer height-to-width aspect ratio of 10:1, may be minimized by ensuring that the same potential difference, like 50 V, for example, is applied between each of the detector ohmic contacts 14 and the common ohmic contact 12.

Commonly, the equipotentials formed within the wafer substrate 10 as shown in FIG. 1A are formed in parallel planes. Consequently, the drift of a photogenerated charge, like that denoted by the dot 16, in the E-field prevents modulation transfer function degradation through lateral spreading. For the present embodiment, a P+ concentration of impurities is used for the ohmic contact layer 12 to provide heavy photon absorption properties to reduce any second surface reflections of the infrared radiation. Similarly, silicon is used as the wafer substrate 10 because its high refractive index beneficially affects the optical cross talk for conversion illumination.

The cross-sectional schematics depicted in FIGS. 1A and 1B illustrate how the shape of the equipotentials within an extrinsically doped substrate 10 changes as the surface area of the detector contacts 14 is changed. In both cases, over most of the substrate thickness, the equipotentials reside in parallel planes and are not influenced by the shape of the detector contacts 14. However, in the immediate vicinity of the small surface contact areas 14, the equipotentials become curved providing for a focussing effect on the released photogenerated charge carriers 16. That is, the released charged carriers 16 generally flow, as depicted by the arrowed line in each case, in a path perpendicular to the equipotential lines. The focussing effect is much more pronounced in the embodiment of FIG. 1B wherein the contacts 14 have a smaller surface area. However, from these two examples, it is basically illustrated that with substantially the same center-to-center spacings a small surface area contact, on the order of say 5 micrometers on the side, for example, will behave substantially the same as a large surface area contact, say 40 micrometers on the side, for example, in terms of its photogenerated charge particle collection efficiency and cross talk characteristics. With this in mind then, the basic principles of applicants' invention may now be described.

Figure 2:
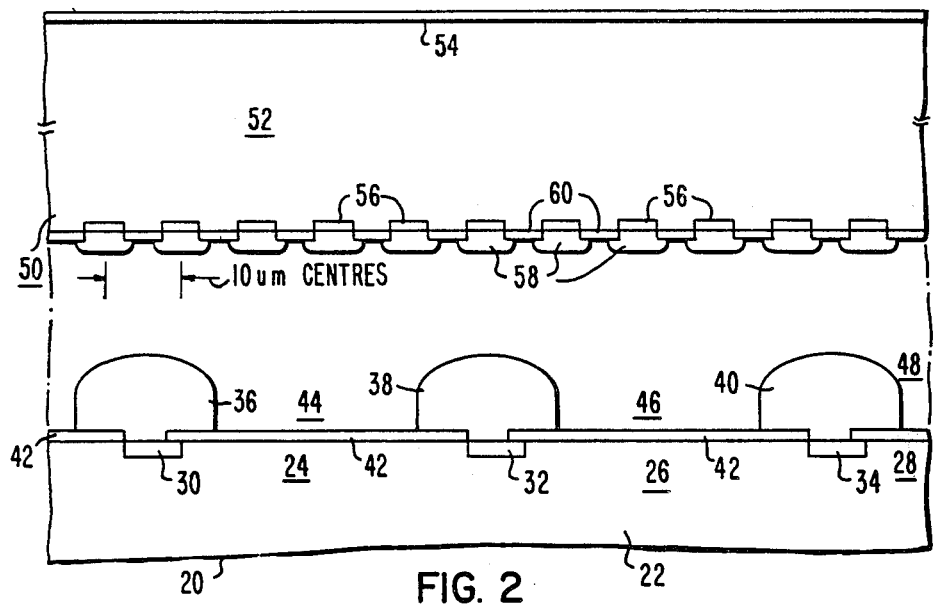
FIG. 2 is a cross-sectional portion of a flip-chip dual integrated circuit configuration of a radiation detector array and signal processor array suitable for embodying the principles of the present invention.

In accordance then with one embodiment of applicants' invention, FIG. 2 illustrates an application of the property of monolithic infrared radiation detector arrays, such as that described in connection with the embodiment of FIG. 1B, to avoid the precise registration step required during a flip-chip bonding operation of the radiation detector integrated circuit array with a signal processing integrated circuit array, such as a charge coupled device, for example. Referring to FIG. 2, a cross-sectional view of a portion of a typical parallel input charge-coupled device array is shown at 20. This cross-sectional view of the CCD includes a substrate body 22 which may be comprised of a silicon material doped with an N-type impurity, for example, and three exemplary signal storage cells located therein in the general vicinity of 24, 26 and 28, for example. Associated with each cell 24, 26 and 28 may be a parallel input signal injection site shown at 30, 32 and 34, respectively. Each of the injection sites may be comprised of regions of the silicon substrate highly doped with P-type impurities, commonly denoted as P+ regions. Metallic contacts 36, 38 and 40 may be provided at each of the signal injection sites 30, 32 and 34 to provide electrical signal connection thereto from an outside or off the chip source.

For conventional charge-coupled devices, typically, dielectric layers may be disposed on the surface of the CCD substrate 22, such as that shown at 42 and may provide electrical insulation between the electrical contacts of the signal injection sites. These dielectric layers 42 may be comprised of silicon dioxide, silicon nitride or a combination of the two. Furthermore, at the surface of the dielectric layers 42 between the electrical contacts in the general area of 44, 46 and 48, there may be provided (not shown) a conentional gate structure of the two phase or four phase CCD variety, for example, for transporting charge from cell to cell.

For the present embodiment, each of the metallic contactors 36, 38 and 40 may be comprised essentially of gold and may be formed over each of the P+ doped injection regions respectively associated therewith by conventional electroplating techniques, for example. The resulting mushroom type bump shape of the metallic contacts 36, 38 and 40 generally arises naturally from the electroplating process, the shape being desirable for the purposes of the present embodiment. Each of the metallic contact bumps 36, 38 and 40 may be formed of a uniform size somewhere in the region between 10 and 25 micrometers diameter while the doped injection area is intentionally kept small on the order of 5 micrometers on the side. The intent here is to keep the CCD parallel input capacitance low, say on the order of a few tenths of a picofarad. Typically, a CCD of this type may be comprised of a 32×32 cellular array constituting 1024 bonding metallic cell contacts which may reside on 50 micrometer centers.

Also in FIG. 2 is shown a portion of a cross-sectional view of an infrared radiation detector integrated circuit 50. The integrated circuit 50 includes a substrate 52 which may be comprised of a silicon material extrinsically doped with an impurity such as indium, for example. Another substrate material which may be suitable for the present embodiment may include intrinsic silicon doped with a P-type impurity. A first side 54 of the substrate 52 may be conditioned for accepting infrared radiation by ion implantation of a P-type impurity contiguously along the surface thereof. One a second side of the substrate 52, opposite the side 54, there may be provided on the surface thereof a two-dimensional array of regions shown illustratively at the locations 56 in FIG. 2. These regions 56 may be highly doped with a P-type impurity to the concentration level of P+, for example. For the present embodiment, disposed at each of the doped regions 56 is a metallic contact 58. On the second surface of the substrate 52 between the metallic contacts 58 may be disposed a layer of dielectric material 60 which may be comprised of silicon dioxide, silicon nitride, or a combination of the two.

In accordance with the present invention then, the array of detector contacts 58, which may be a two-dimensional matrix, for example, may be fabricated on the second side of the detector substrate 52 at a much higher density than the density of the CCD parallel injection contacts 36, 38 and 40 for substantially the same surface area. For example, the detector contacts 58 may be fabricated with a surface area of five micrometers on a side and reside on 10 micrometer center-to-center spacings whereas the cell contacts 36, 38 and 40 may have a uniform diameter in the range between 10 and 25 micrometers and reside on 50 micrometer centers. Accordingly, the detector contacts 58 may be described as gold pads on the order of 1 to 3 micrometers in thickness while the cell contacts may be described as gold bumps having a substantially greater thickness. In contrast then, the detector contact array may have a density on the order of 25 times that of the CCD cell array.

In the gold electroplating fabrication step, it is understood that a suitable metalization foundation may be utilized on both substrate wafers 22 and 52 to promote adherence of the gold contact material to the silicon material and to inhibit interdiffusion of the gold contact material into the silicon substrate.

Figure 3:
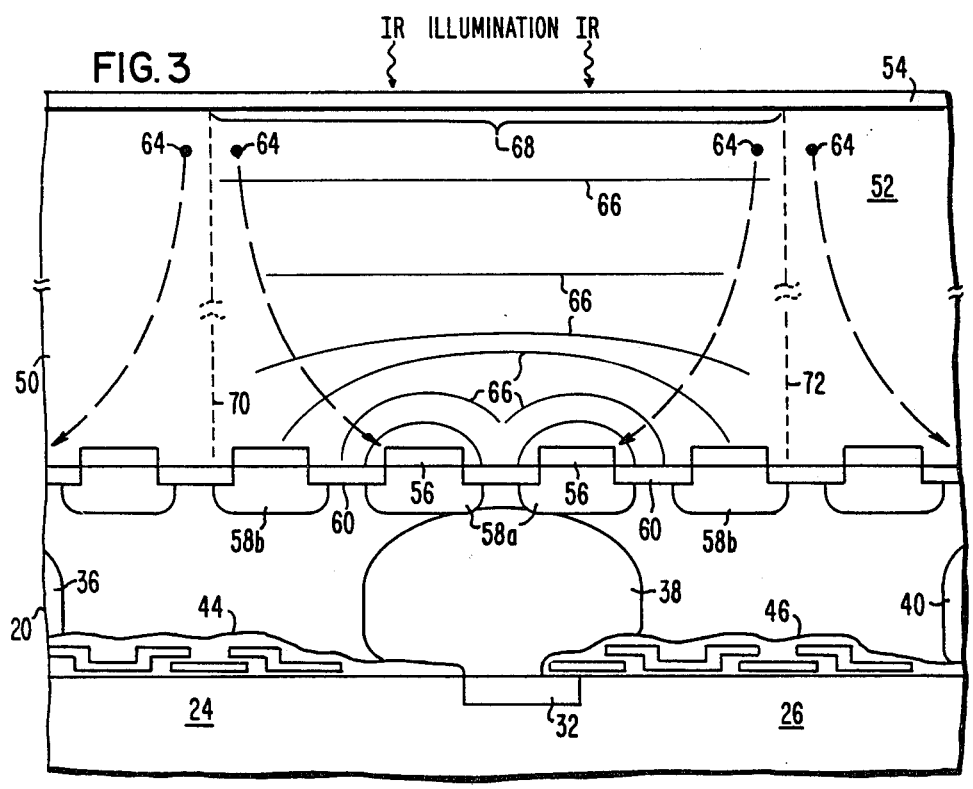
FIG. 3 depicts a cross-sectional view of an exemplary cell contact of the embodiment of FIG. 2 for the purposes of illustrating the operation thereof in greater detail.

Ostensibly, the two integrated circuits 20 and 50, as described in connection with the embodiment of FIG. 2, may be flip-chip bonded together through their metallic detector and cell contacts without substantial precision pre-alignment. Each cell contact 36, 38 or 40 of the CCD 20 may be bonded to a corresponding group of detector contacts 58 in the flip chip bonding operation. A cross-sectional view of the interconnection of an exemplary cell contact 38 of the CCD integrated circuit 20 with a group of detector contacts of the radiation detector 50 is shown in FIG. 3 wherein the metallic detector contacts of the bonded group are denoted by 58a. It is understood that conventional bonding techniques, like thermal compression bonding, for example, may be used to form the connection between the cell and detector contacts. It is further understood that while only one cell 38 is shown in FIG. 3, all of the other cell contacts of the CCD array 20 may be similarly bond to their corresponding groups of detector contacts during the same bonding step.

Figure 5:
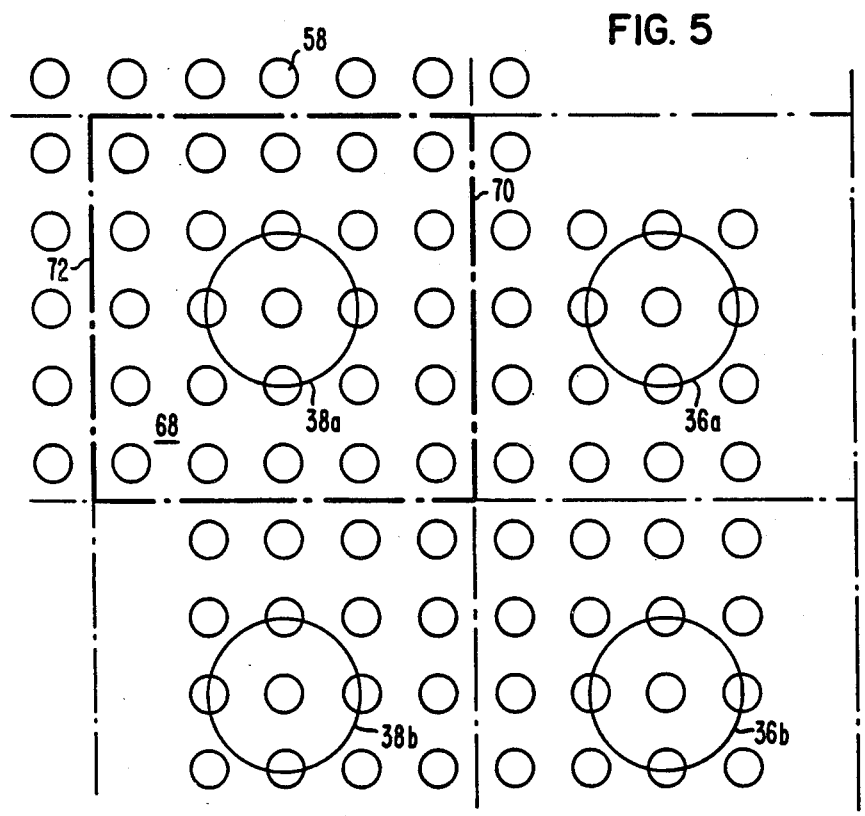
FIG. 5 is a plan view of a portion of the bonded arrays of either of the embodiments as shown in FIGS. 4 or 5.

To further illustrate the innerconnection of the integrated circuit chips 20 and 50, a plan view of a portion of the bonded arrays are depicted in FIG. 5. Each cell contact is denoted as a large solid line circles like that shown at 36A, 36B, 38A and 38B and each detector contact is denoted by the smaller solid line circles denoted as 58. The intersection of the larger circles with the smaller circles denotes a bond therebetween. In the plan view of example of FIG. 5, the detector array contacts may be on the order of 5 micrometers in diameter and reside on 10 micrometer centers and the CCD cell array contacts may be on the order of 20 micrometers in diameter and reside on 50 micrometer centers. With the exemplary geometric alignment of the detector and CCD arrays as shown in FIG. 5, each cell contact may be bonded to a group of five of the detector contacts. However, in general, it is understood that this need not be the case. In fact, it really doesn't matter how many detector contacts in a group are bonded to each cell contact, be it one, two or more. The effective elemental image size or pixel is predetermined or predefined primarily in accordance with the center-to-center spacing of the CCD cells (i.e., 50 micrometers) and is independent of whether 1, 2 or more of the detector contacts are bonded to a cell contact during the bonding operation. The unbonded detector contacts like that shown at 58b, for example, may be left to float electrically and not disturb the focussing effect on the photogenerated charge carriers by the bonded contacts, 58a. This concept may be better understood through the following description of a typical operational case.

Referring to FIG. 3, as infrared radiation impinges on the back contact 54 of the radiation detector integrated circuit 50, photogenerated charge carriers, denoted by the dots 64, are released from the extrinsically doped silicon substrate 52 in the vicinity of the first side surface thereof. The amount of photogenerated charge carriers 64 released at any given point along the first side surface area of the substrate 52 is commensurate with the intensity of the infrared radiation impinging thereon. The released charge carriers 64 then migrate to the bonded detector contacts 58a at the second side of the substrate 52 in accordance with the E-fields produced in the substrate 52.

Each of the bonded groups of detector contacts 58a form equipotential regions, denoted by the solid line 66, which are similar to those described in connection with the embodiment of FIG. 1. These equipotential lines 66 provide a focussing effect on the migrating released charge carriers 64 to guide substantially all of the photogenerated carriers 64 within a surface area, 68, for example, to the bonded group of detector contacts 58a correspondingly associated therewith. Therefore, in the present example, those released carriers 64 which reside in a substrate volume outlined by dotted lines 70 and 72, lying beneath the surface area 68 generally are conducted to the detector contacts 58a, cell contact 38 and the injection site 32 of the CCD cell 26 to provide an electrical signal measure of the infrared elemental radiation impinged on the first side surface area 68 of the radiation detector 50.

Those released carriers 64 in the substrate volume in the general vicinity to the left of the dotted line 70 will be caused to migrate towards the bonded detector contacts associated with the cell contact 36 and thereby be injected into the site 30 of the CCD cell 24. Likewise, those released charge carriers 64 in the volume of the substrate 52 in the general vicinity to the right of the dotted line 72 will be caused to migrate to the detector contacts bonded to the cell contact 40 and thereafter be injected into the site 34 of the CCD cell 28. Accordingly, the electrical signal levels stored in the CCD cells 24 and 28 will be representative of the elemental infrared radiation levels impinging on the corresponding first surface areas of the radiation detector 50 which are defined by the bonded groups of detector contacts respectively corresponding thereto.

The foregoing operational example has been described in connection with a photoconductive infrared radiation detector using an extrinsically doped silicon material for the substrate thereof. In these type radiation detectors, it is commonly known that the type of impurity diffused or implanted in the silicon material of the substrate generally predefines the wavelength window of infrared radiation of which the detector 50 is most sensitive towards.

While a photoconductive radiation detector embodiment has been used hereabove to describe one aspect of the present invention, the present invention should not be so limited. Another embodiment equally suitable for application of the principles of applicants' invention is one which utilizes a photovoltaic radiation detector array, an example of which is illustrated schematically in cross-sectional view in FIG. 4. The schematic of FIG. 4 is a portion of a flip-chip configuration including a photovoltaic radiation detector array 80 using an intrinsic material, such as HgCdTe, for example, as the substrate thereof, and a conventional silicon CCD integrated circuit 100.

Figure 4:
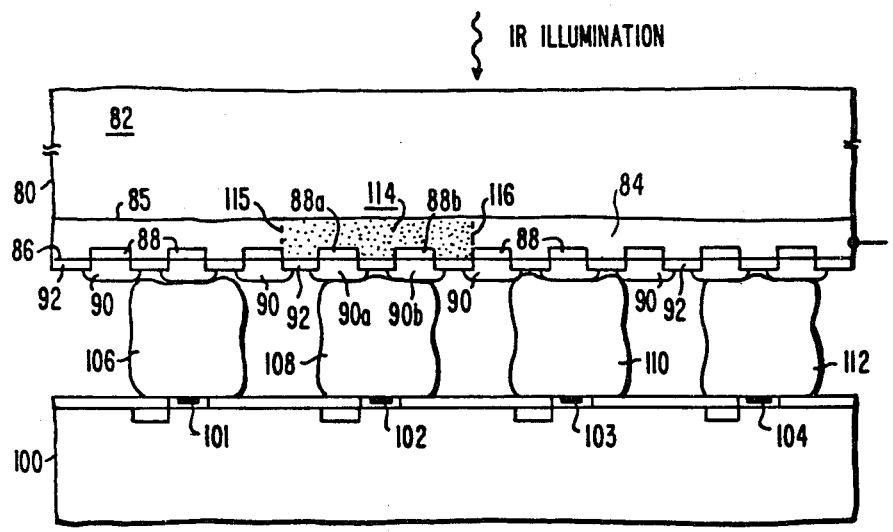
FIG. 4 is a cross-sectional portion of an alternate embodiment of a flip-chip dual integrated circuit configuration suitable for embodying the principles of the present invention.

Referring to the embodiment of FIG. 4, the photovoltaic type infrared radiation detector 80 may be comprised of an infrared transparent substrate 82 which may be made from a material like CdTe, for example. A layer of intrinsic material 84, which may be HgCdTe doped with a P-type impurity for example, may be formed over a surface 85 of the substrate 82. In the present embodiment, this formation may be conventionally performed by liquid phase epitaxy techniques. A high density array of doped regions 88 with an N-type impurity may be formed on the surface 86 of the layer 84. The combination of the N-type doped regions 88 and the P-type doped layer 84 provide for a high density array of PN—HgCdTe diodes formed along the surface 86 of the integrated circuit 80. A metallic contact 90 is appropriately formed on top of each doped region 88 for purposes of making electrical connection thereto. The metallic contacts 90 may be insulated from one another along the surface 86 by the conventional application of a dielectric layer 92 which may be comprised of silicon dioxide, silicon nitride or a combination of the two.

Also in FIG. 4, the integrated circuit of the CCD signal storage array 100 is of a conventional type similar to the one described in connection with the embodiments of FIGS. 2 and 3 hereabove. Examples of injection sites for corresponding cells of the CCD array are shown formed at points 101, 102, 103 and 104 and respectively formed at each of the injection site regions are metallic cell contacts 106, 108, 110 and 112. Each of the metallic cell contacts 106, 108, 110 and 112 may be bonded to a corresponding group of detector contacts 90 in a flip-chip dual integrated circuit configuration similar to that described in connection with FIGS. 2 and 3 hereabove.

The N-type doped regions 88 associated with the bonded detector contacts, denoted by 90a and 90b, may be reverse biased in accordance with an appropriately-applied potential as conventionally provided through the corresponding bonded cell contact, like 108, for example. Charge carriers photogenerated within the depletion region of these diodes corresponding to contacts 90a and 90b or within a diffusion length of this diffusion region may be collected therein and passed to the CCD cell in the integrated circuit 100 corresponding to the geometric alignment of the arrays. Accordingly, those diodes which have unbonded metallic detector contacts are not capable of collecting photogenerated charge carriers. Thus, provided the photogenerated carrier charge diffusion lengths in the P-type intrinsic material active layer 84 are reasonably long, say on the order of 20 micrometers or greater, for example, the active optical detector area may be defined only by an effective "capture cross-section" of each metallic cell contact, that is, the CCD infrared radiation image pixel size.

For example, in FIG. 4, detector contacts 90a and 90b are bonded to the cell contact 108 with the appropriately applied potential across the associated diodes 88a and 88b in the layer 84. The photogenerated charge carriers denoted by the dots surrounding the diodes 88a and 88b will be collected in the depletion regions of the diodes 88a and 88b. In so doing, an elemental region 114 between the dashed lines 115 and 116 may be so defined. Consequently, the electrical signal supplied to the corresponding cell in the CCD array (i.e. associated with the injection point 102) will be representative of an elemental image or pixel of the infrared radiation illuminating the surface of the transparent substrate 80 as defined by the region 114. Thus, in the same manner, all of the cells of the CCD array may be supplied with electrical signals representative of their corresponding infrared radiation pixels to form compositely an electrical image array representative of the infrared radiation image illuminating the transparent substrate 80.

With regard to the dual integrated circuit flip chip configuration embodiment described in connection with FIG. 4, it is understood that in using different materials for the substrates of the two integrated circuits 80 and 100, a mismatch in expansion coefficients can be expected. For this reason then, a more flexible metallic material, such as indium, for example, may be considered for the metallic cell and detector contacts. All other considerations such as center-to-center spacings and metallic contact size may be kept substantially the same or in proportion to the embodiments described in connection with FIGS. 2 and 3 hereabove.

In the past, it has been considered an extremely difficult task to flip-chip bond integrated circuits of high density elemental arrays. For example, in bonding a 32×32 elemental array, 1,024 interconnections must be reliably bonded to ensure a complete electrical image of the infrared radiation focussed on the detection plane. The precision registration for alignment on a parallel element-to-element basis has been a primary obstacle in the fabrication process. However, by utilizing the principles of the present invention, this obstacle appears to be substantially eliminated. Therefore, it is anticipated that extremely large arrays of radiation detector integrated circuits and signal processing integrated circuits may be fabricated separately and then bonded together for the purposes of simultaneously fabricating a plurality of high density infrared radiation focal plane arrays in a batch fabrication method utilizing the principles of applicants' invention.

Figure 6A:
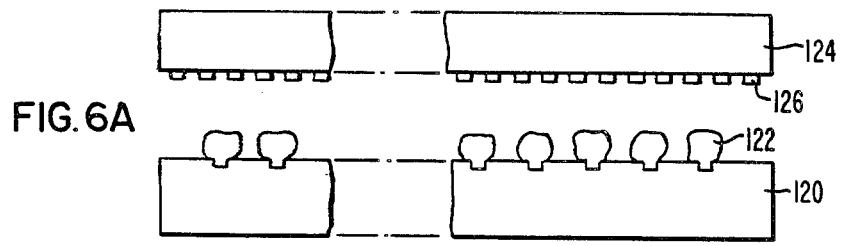
FIGS. 6A through 6E depict the steps of a method of batch-fabricating a plurality of high-density flip-chip bonded dual integrated circuit array configurations.

One method for fabricating a plurality of high density infrared radiation focal plane arrays in illustrated by the steps depicted in FIGS. 6A through 6E. Referring to FIG. 6A, once having separately fabricated a signal processor integrated circuit 120, like a CCD, having a large MXN signal storage cell array and corresponding cell contacts 122, and an infrared radiation detector integrated circuit 124, having a much larger array of detector contacts 126 than the CCD array of cell contacts 122, the aforesaid two integrated circuits 120 and 124 may be bonded together in a flip-chip configuration by conventional bonding techniques like thermal compression bonding. During this step it may be appreciated that precision alignment of the contacts 122 and 126 is not a prerequisite because the number of detector contacts 126 being bonded to each cell contact 122 is not significant to the operation of the integrated circuit combination. Consequently, only a rough alignment by a simple mechanical fixture (not shown) may be all that is required.

Figure 6B:
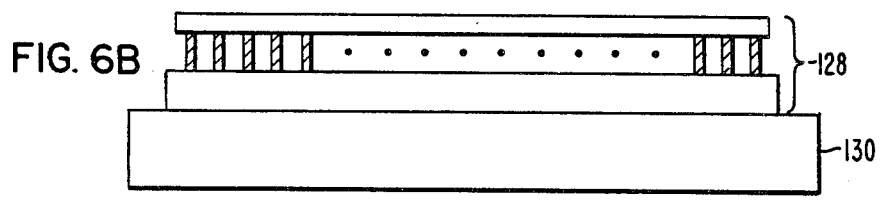
Figure 6C:
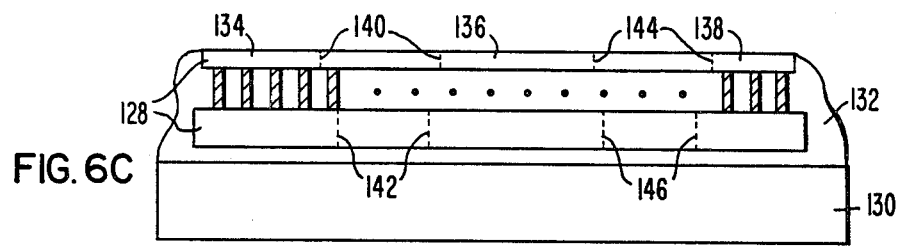
Figure 6D:
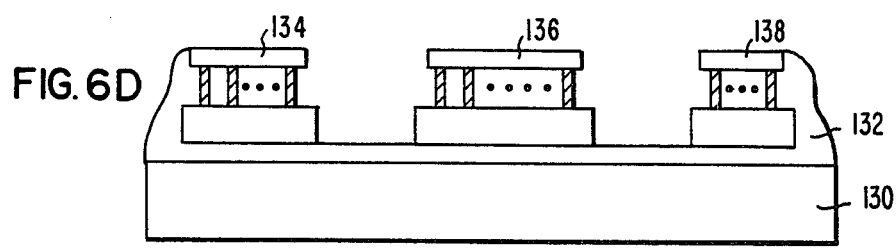
Figure 6E:
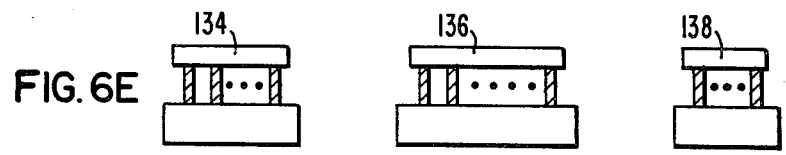

Referring to FIG. 6B, after the bonding step, the bonded dual integrated circuit configuration 128 may be attached to a flat support member 130 made of a material similar in properties to quartz, for example. Thereafter, as shown in FIG. 6C, a material 132 such as black wax or a conventional photoresist, which is liquid at temperatures slightly above room temperature, may be allowed to flow between the dual integrated circuit configuration and the support member 130 with an ambient temperature slightly elevated above room temperature. The fluid material 132 may then be allowed to cool to approximately room temperature at which time it should become a solid thereby providing mechanical support for the dual chip configuration 128 as seated on the support member 130.

From the overall dual chip configuration array 128, predefined array dye slices like that shown at 134, 136 and 138, for example, may be divided. For example, array dyes 134, 136 and 138 which may be outlined by the dotted line combinations 140, 142 and 144, 146 may be sawed apart with a precision diamond saw stepped accurately in accordance with the dimensions of each of said predefined array dyes. The resulting array dyes 134, 136 and 138 may appear as that shown in FIG. 6D. In this process step, adequate dead area should be allowed at the edges of each of the sectioned array dyes so that their performance may not be affected by the end cutting effects. In addition, each of the array dyes 134, 136 and 138 may be so predefined that there may be access to the bonding pads which are provided conventionally to bring in the electrical voltages required for operation thereof.

Finally, after the separation step, the semiliquid supporting material 132 may be cleaned from the sectioned array dyes 134, 136 and 138, thus leaving the finished products (see FIG. 6E) in preparation for possibly a testing operation. In this manner, it may be possible then as proposed by the method steps hereabove to fabricate a plurality of focal plane array dual integrated circuit flip-chip configurations, having arrays on the order of 16×32 or 32×32, simultaneously in a batch-fabricating operation.

The aforesaid batch fabrication method tends to result in high yields because it does not require precision alignment of the high density of elements of the arrays of the integrated circuits to ensure complete bonding therebetween. The above batch fabrication method is amenable to either photoconductive or photovoltaic type infrared radiation detector focal plane arrays. Because of the much higher density of detector contacts with respect to the cell contacts of the two integrated circuits, there is offered a degree of redundancy in the batch fabrication bonding operation in forming the flip-chip geometric array configuration. Therefore, a high interconnect reliability is anticipated.

We claim:

1. A method of batch-fabricating a plurality of high-density flip-chip bonded dual integrated circuit arrays comprising the steps of:

fabricating a first integrated circuit for signal processing having a first array of electrical signal storage cells with an injection region and a metallic cell contact disposed at each cell;

fabricating a second integrated circuit for radiation detection having a substrate with a first side conditioned for accepting a radiation image thereon, and a second side, opposite said first side, including a second array of metallic detector contacts disposed on the surface thereof, said second array being fabricated with a greater density of contacts than said first array for substantially equal surface areas, each metallic detector contact being fabricated of a physical size which is smaller than said metallic cell contacts;

bonding each metallic cell contact of said first integrated circuit to a corresponding group of metallic detector contacts of said second integrated circuit to render a dual integrated circuit flip-chip configuration; and dividing the bonded dual integrated circuit flip-chip configuration into a plurality of high-density dual integrated circuit flip-chip bonded predetermined arrays.

2. The method in accordance with claim 1 wherein the step of fabricating the first integrated circuit includes electroplating at least one metallic material on the surface of the first integrated circuit at each cell injection region to provide the first array of metallic cell contacts.

3. The method in accordance with claim 1 wherein the step of fabricating the second integrated circuit includes electroplating at least one metallic material at each of the second array geometric positions on the surface of the second side of the second integrated circuit to provide the second array of metallic detector contacts.

4. The method in accordance with claim 1 wherein the step of bonding includes thermal compression bonding each metallic cell contact of the first integrated circuit with its corresponding group of metallic detector contacts of the second integrated circuit, concurrently, to render the dual integrated circuit flip-chip configuration.

5. The method in accordance with claim 1 wherein the step of dividing includes the steps of:

providing a mechanical support for the bonded dual integrated circuit flip-chip configuration;

predefining each of the plurality of dual integrated circuit arrays;

physically sectioning said predefined circuit arrays from each other; and removing said sectioned plurality of predefined circuit arrays from their mechanical support.

6. The method in accordance with claim 1 wherein the step of dividing further includes the steps of:

disposing the bonded dual integrated circuit flip-chip configuration on the surface of a flat support member;

flowing a material, which is liquid at temperatures above a first temperature, between the dual integrated circuits of the flip-chip configuration and between the configuration and said flat support member at temperatures above said first temperature;

allowing said material to cool below said first temperature and become solid to provide a mechanical support for the bonded dual integrated circuit configuration;

predefining each of the plurality of dual integrated circuit arrays in accordance with predetermined physical dimensions thereof;

cutting the predefined circuit arrays away from each other along said predetermined physical dimensions; and removing said material from said cut-away circuit arrays to release them from their mechanical support.

7. The method in accordance with claim 6 wherein the step of cutting includes sawing apart the predefined flip-chip circuit arrays along theie predetermined dimensions.

8. The method in accordance with claim 6 wherein the step of removing the material includes cleaning the material from the surfaces of the cut-away circuit arrays to release them from their mechanical support.

* * * * *